United States Patent
An et al.

(10) Patent No.: US 7,259,425 B2
(45) Date of Patent: Aug. 21, 2007

(54) TRI-GATE AND GATE AROUND MOSFET DEVICES AND METHODS FOR MAKING SAME

(75) Inventors: Judy Xilin An, San Jose, CA (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 73 days.

(21) Appl. No.: 10/348,911

(22) Filed: Jan. 23, 2003

(65) Prior Publication Data

US 2004/0145000 A1    Jul. 29, 2004

(51) Int. Cl.
    *H01L 29/72*    (2006.01)
(52) U.S. Cl. ............... 257/341; 257/288; 257/330; 257/368; 257/401; 257/618
(58) Field of Classification Search ........... 257/270, 257/271, 274, 275, 315, 317, 320, 288, 330, 257/341, 368, 401, 618
    See application file for complete search history.

(56) References Cited

U.S. PATENT DOCUMENTS

| | | | |
|---|---|---|---|
| 4,979,014 A | 12/1990 | Hieda et al. .................. 357/56 |
| 6,359,311 B1 | 3/2002 | Colinge et al. ............. 257/347 |
| 6,413,802 B1* | 7/2002 | Hu et al. .................... 438/151 |
| 6,433,609 B1* | 8/2002 | Voldman .................... 257/270 |
| 6,525,403 B2 | 2/2003 | Inaba et al. ................. 257/618 |
| 6,812,119 B1 | 11/2004 | Ahmed et al. .............. 438/585 |
| 2002/0003255 A1 | 1/2002 | Usuki et al. |
| 2002/0125536 A1 | 9/2002 | Iwasa et al. ................ 257/368 |
| 2002/0153587 A1 | 10/2002 | Adkisson et al. ........... 257/510 |
| 2002/0177263 A1 | 11/2002 | Hanafi et al. .............. 438/183 |
| 2003/0042531 A1* | 3/2003 | Lee et al. .................... 257/315 |
| 2003/0113970 A1* | 6/2003 | Fried et al. ................ 438/286 |
| 2004/0075121 A1 | 4/2004 | Yu et al. ..................... 257/288 |
| 2004/0110331 A1* | 6/2004 | Yeo et al. ................... 438/199 |
| 2004/0195628 A1* | 10/2004 | Wu et al. .................... 257/351 |

FOREIGN PATENT DOCUMENTS

EP    0 623 963 A1    11/1994

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

(Continued)

*Primary Examiner*—Edward Wojciechowicz
(74) *Attorney, Agent, or Firm*—Harrity Snyder LLP

(57) ABSTRACT

A triple gate metal-oxide semiconductor field-effect transistor (MOSFET) includes a fin structure, a first gate formed adjacent a first side of the fin structure, a second gate formed adjacent a second side of the fin structure opposite the first side, and a top gate formed on top of the fin structure. A gate around MOSFET includes multiple fins, a first sidewall gate structure formed adjacent one of the fins, a second sidewall gate structure formed adjacent another one of the fins, a top gate structure formed on one or more of the fins, and a bottom gate structure formed under one or more of the fins.

18 Claims, 18 Drawing Sheets

OTHER PUBLICATIONS

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub-50 nm FinFET: PMOS," 1999 IEEE, IEDM, pp. 67-70.

Yang-Kyu Choi et al., "Nanoscale CMOS Spacer FinFet for the Terabit Era," IEEE Electron Device Letters, vol. 23, No. 1, Jan. 2002, pp. 25-27.

U.S. Appl. No. 10/653,105, filed Sep. 3, 2003, Bin Yu et al.; Additional Gate Control For a Double-Gate Mosfet; 27pages.

Jong-Tae Park et al.: "Multiple-Gate SOI MOSFETs: Device Design Guidelines," *IEEE Transactions on Electron Devices*, vol. 49, No. 12, Dec. 2002, pp. 2222-2229.

Fu-Liang Yang et al.: "25 nm CMOS Omega FETs," International Electron Devices Meeting 2002, IEDM, Technical Digest, Dec. 8-11, 2002 in New York, NY, pp. 255-258.

Toshikazu Mukaiyama et al.: "Fabrication of Gate-All-Around MOSFET By Silicon Anisotropic Etching Techniques," *Solid State Electronics*, Elsevier Science Publishers, vol. 42, No. 7-8, Jul. 8, 1998, pp. 1623-1626.

Yang-Kyu Choi et al.: "Spacer FinFET: nanoscale double-gate CMOS technology for the terabit era," *Solid State Electronics*, Elsevier Science Publishers, vol. 46, No. 10, Oct. 2002, pp. 1595-1601.

Effendi Leobandung et al.: "Wire-channel and wrap-around-gate metal-oxide-semiconductor field-effect transistors with a significant reduction of short channel effects," 41st International Conference on Electron, Ion, and Photon Beams Technology and Nanofabrication in Dana Point, CA, May 27-30, 1997, vol. 15, No. 6, *Journal of Vacuum Science & Technology B* (Microelectronics and Nanometer Structures), Nov.-Dec. 1997, AIP for American Vacuum Soc., pp. 2791-2794.

PCT International Search Report mailed Jul. 13, 2004, 5 pages.

U.S. Appl. No. 10/274,961, filed Oct. 22, 2002; Ming-Ren Lin et al.; "Double and Triple Gate Mosfet Devices and Methods for Making Same;" 28 pages.

U.S. Appl. No. 10/348,758, filed Jan. 23, 2003; Judy Xilin An et al.; "Germanium Mosfet Devices and Methods for Making Same;" 51 pages.

* cited by examiner

TRI-GATE AND GATE AROUND MOSFET DEVICES AND METHODS FOR MAKING SAME

FIELD OF THE INVENTION

The present invention relates generally to semiconductor manufacturing and, more particularly, to triple gate and gate around metal-oxide semiconductor field-effect transistor (MOSFET) devices and methods of making these devices.

BACKGROUND OF THE INVENTION

Scaling of device dimensions has been a primary factor driving improvements in integrated circuit performance and reduction in integrated circuit cost. Due to limitations associated with gate-oxide thicknesses and source/drain (S/D) junction depths, scaling of existing bulk MOSFET devices beyond the 0.1 µm process generation may be difficult, if not impossible. New device structures and new materials, thus, are likely to be needed to improve FET performance.

Double-gate MOSFETs represent new devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention provide triple gate and gate around FinFET devices and methods for manufacturing these devices.

In one aspect consistent with the principles of the invention, a triple gate metal-oxide semiconductor field-effect transistor (MOSFET) includes a fin structure, a first gate formed adjacent a first side of the fin structure, a second gate formed adjacent a second side of the fin structure opposite the first side, and a top gate formed on top of the fin structure.

In another aspect, a gate around MOSFET includes multiple fins, a first sidewall gate structure formed adjacent one of the fins, a second sidewall gate structure formed adjacent another one of the fins, a top gate structure formed on one or more of the fins, and a bottom gate structure formed under one or more of the fins.

In yet another aspect, a method for forming gates in a MOSFET is provided. The method includes forming a fin structure on a substrate; forming sidewall gate structures adjacent the fin structure; and forming a top gate structure on top of the fin structure.

In a further aspect, a method for forming gates in a MOSFET is provided. The method includes forming a fin structure on a substrate; forming sidewall gate structures adjacent the fin structure; removing one or more portions of the fin structure to form fins; forming at least one additional gate structure under the fins; and forming at least one additional gate structure over the fins.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide triple gate and gate around FinFET devices and methods for manufacturing these devices.

Triple Gate MOSFET

Figure 1:
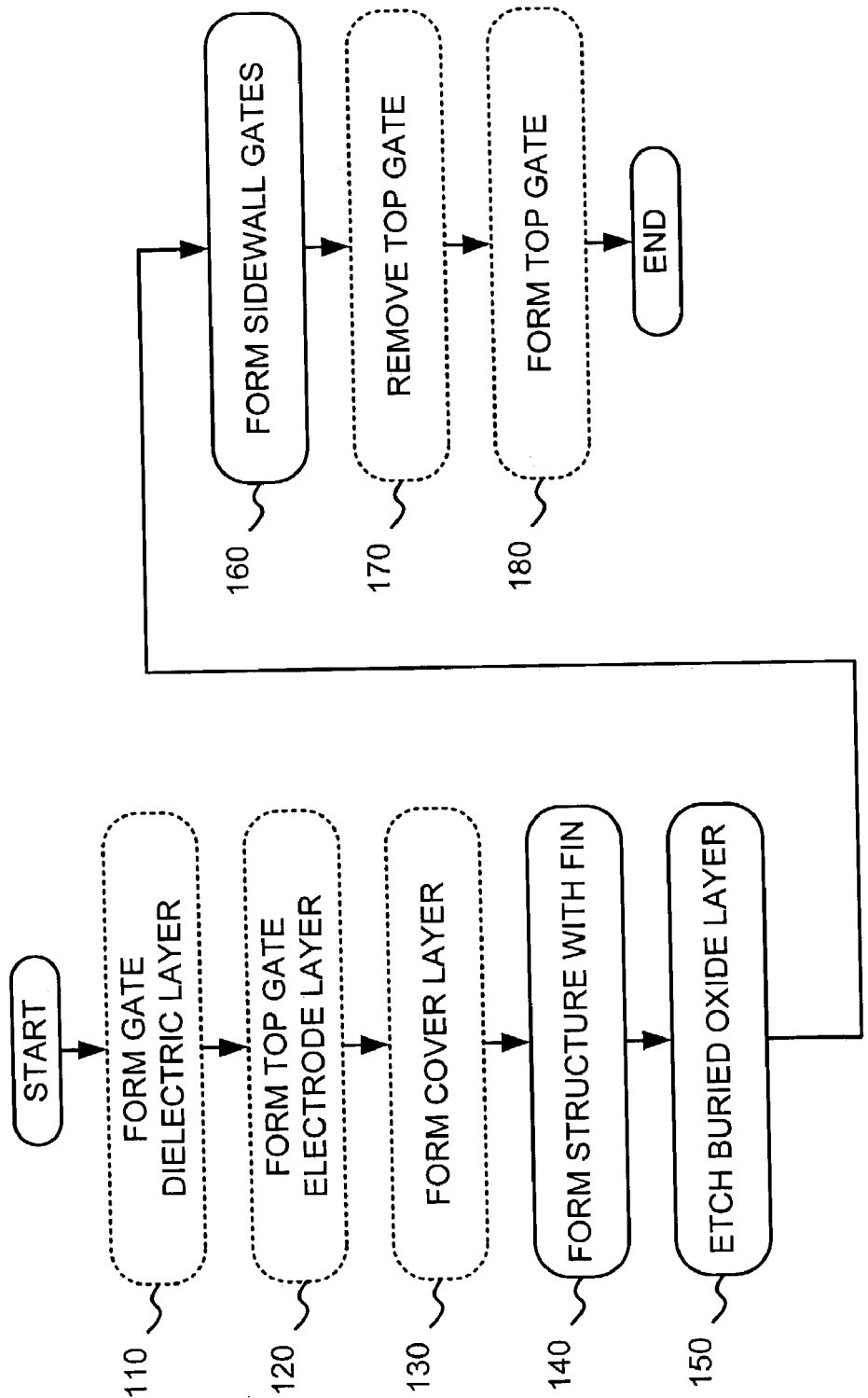
FIG. 1 illustrates an exemplary process for fabricating a triple gate MOSFET in an implementation consistent with the principles of the invention.

FIG. 1 illustrates an exemplary process for fabricating a triple gate MOSFET in an implementation consistent with the principles of the invention. FIGS. 2-6 illustrate exemplary cross-sectional views of a MOSFET fabricated according to the processing described with regard to FIG. 1.

Figure 2:
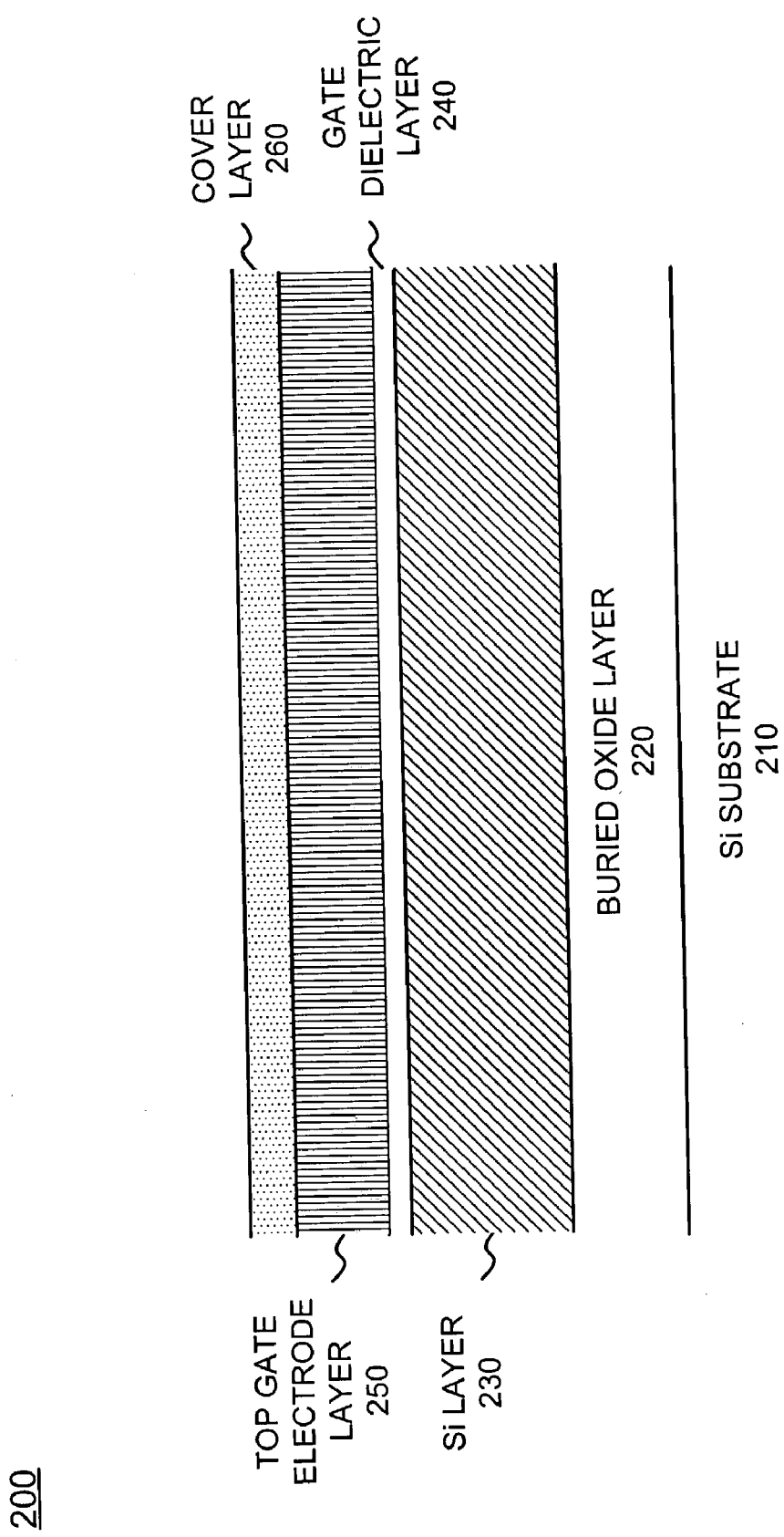
FIGS. 2-6 illustrate exemplary cross-sectional views of a triple gate MOSFET fabricated according to the processing described in FIG. 1.

With reference to FIGS. 1 and 2, processing may begin with semiconductor device 200. Semiconductor device 200 may include a silicon on insulator (SOI) structure that includes a silicon substrate 210, a buried oxide layer 220 and a silicon layer 230 on the buried oxide layer 220. Buried oxide layer 220 and silicon layer 230 may be formed on substrate 210 in a conventional manner. The thickness of buried oxide layer 220 may range, for example, from about 500 Å to 3000 Å. The thickness of silicon layer 230 may range from about 200 Å to 1000 Å. It will be appreciated that silicon layer 230 is used to form the fin. In alternative implementations, substrate 210 and layer 230 may include other semiconductor materials, such as germanium, or combinations of semiconductor materials, such as silicon germanium. Buried oxide layer 220 may include a silicon oxide or other types of dielectric materials.

A gate dielectric layer 240 may optionally be deposited or thermally grown on silicon layer 230 (act 110). Gate dielectric layer 240 may be formed at a thickness ranging from approximately 5 Å to 30 Å. Gate dielectric layer 240 may include conventional dielectric materials, such as an oxide (e.g., silicon dioxide). In other implementations, a nitride material, such as a silicon nitride, may be used as the gate dielectric material.

A top gate electrode layer 250 may optionally be deposited over gate dielectric layer 240 for forming the top gate (act 120). Gate electrode layer 250 may be formed at a thickness ranging from approximately 100 Å to 1000 Å. A number of conductive materials may be used for gate electrode layer 250. For example, gate electrode layer 250 may include a metal (e.g., tungsten, tantalum, aluminum, nickel, ruthenium, rhodium, palladium, platinum, titanium, molybdenum, etc.), a metal containing a compound (e.g., titanium nitride, tantalum nitride, ruthenium oxide, etc.), or a doped semiconductor material (e.g., polycrystalline silicon, polycrystalline silicon-germanium, etc.).

A cover layer 260 (or hard mask) may optionally be formed on top of gate electrode layer 250 to aid in pattern optimization and protect top gate electrode layer 250 during subsequent processing (act 130). Cover layer 260 may, for example, include a silicon nitride material or some other type of material capable of protecting the gate electrode during the fabrication process. Cover layer 260 may be deposited, for example, by chemical vapor deposition (CVD) at a thickness ranging from approximately 100 Å to 300 Å.

Figure 3:
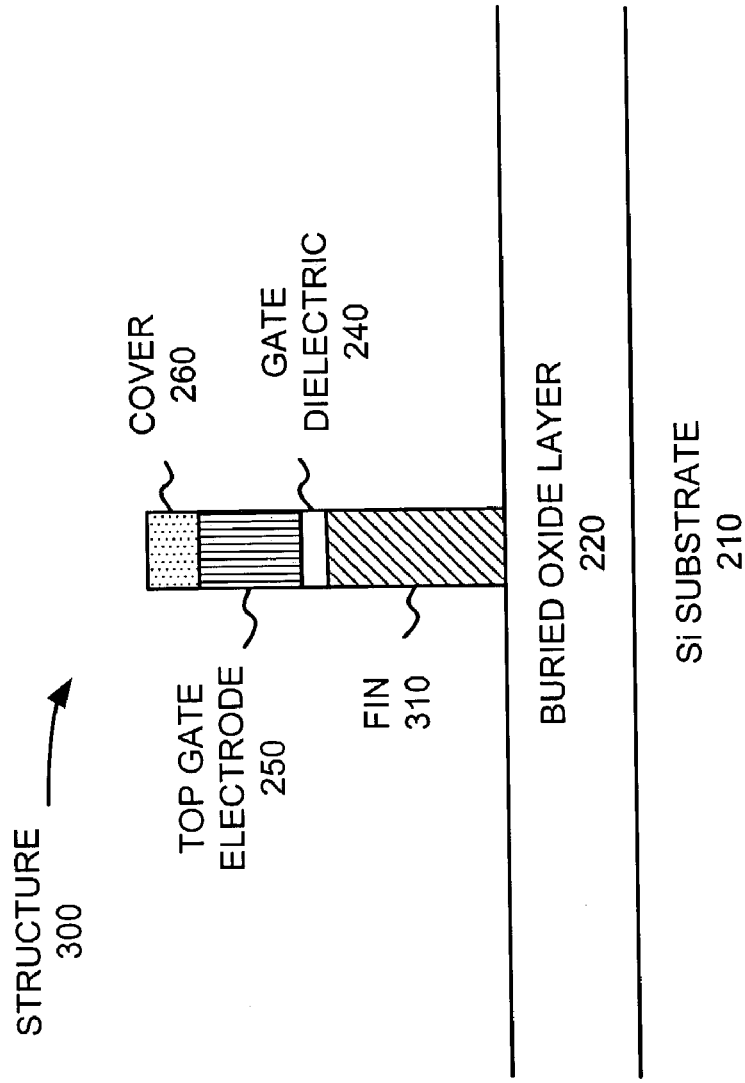

Silicon layer 230, gate dielectric layer 240, and top gate electrode layer 250 may be patterned by conventional lithographic techniques (e.g., electron beam (EB) lithography). Silicon layer 230 and layers 240/250 may then be etched using well-known etching techniques to form structure 300, as illustrated in FIG. 3 (act 140). Structure 300 includes fin 310, gate dielectric 240, top gate electrode 250, and cover 260. The width of fin 310 may range from approximately 50 Å to 1000 Å.

Following the formation of structure 300, a portion of buried oxide layer 220 may be removed using, for example, one or more conventional etching techniques (act 150). In one implementation, buried oxide layer 220 may be etched to a depth ranging from about 200 Å to about 500 Å. During the etching, a portion of buried oxide layer 220 below fin 310 may be removed, as illustrated in FIG. 4.

Figure 4:
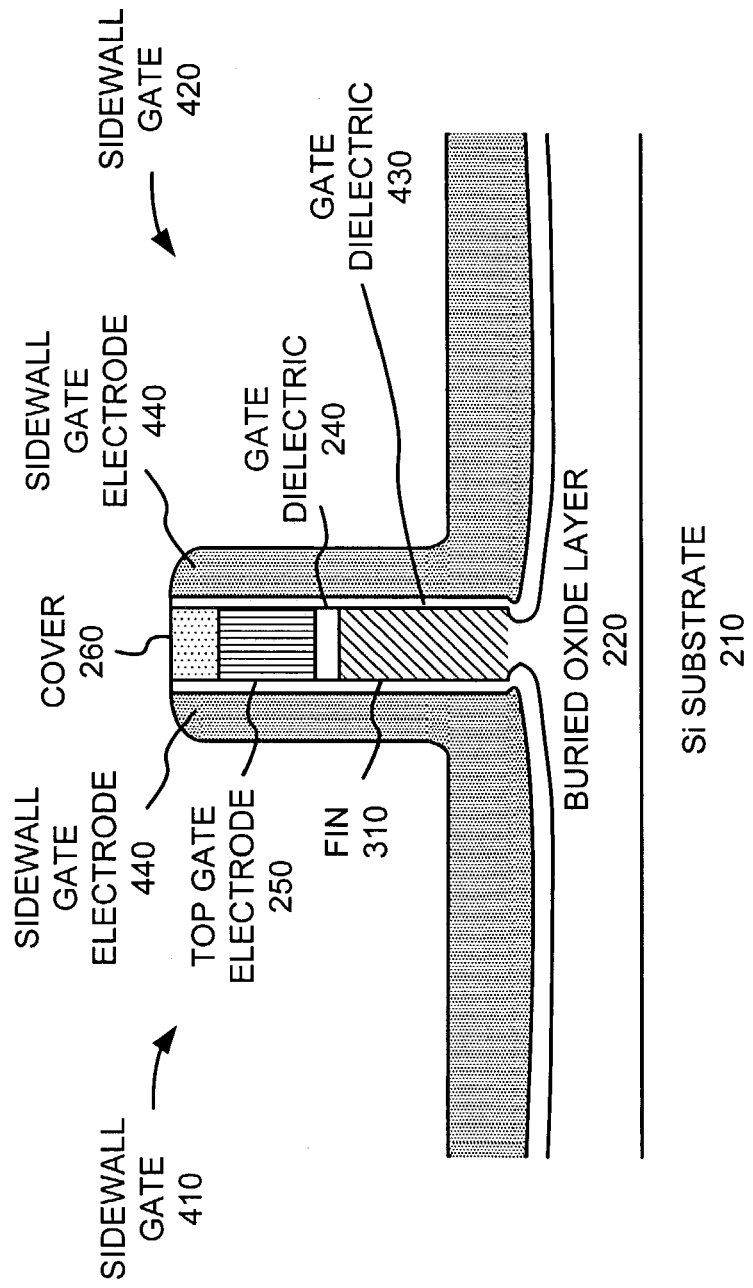

Sidewall gates 410 and 420 may then be formed, as illustrated in FIG. 4 (act 160). For example, a gate dielectric layer 430 may optionally be deposited or thermally grown on the side surfaces of structure 300 using known techniques. Gate dielectric layer 430 may be formed at a thickness ranging from approximately 5 Å to 30 Å. Gate dielectric layer 430 may include conventional dielectric materials, such as an oxide (e.g., silicon dioxide). In other implementations, a silicon nitride or other materials may be used to form the gate dielectric.

A gate electrode layer 440 may then be deposited over semiconductor device 200 to form sidewall gate electrodes 440, as illustrated in FIG. 4. Gate electrode layer 440 may be formed at a thickness ranging from approximately 100 Å to 1000 Å. Similar to top gate electrode layer 250, a number of materials may be used for sidewall gate electrode layer 440. Gate electrode layer 440 may be planarized, using, for example, a chemical-mechanical polishing (CMP), to expose the top surface of cover 260 and form two separate sidewall gates 410 and 420, as illustrated in FIG. 4.

Figure 5:
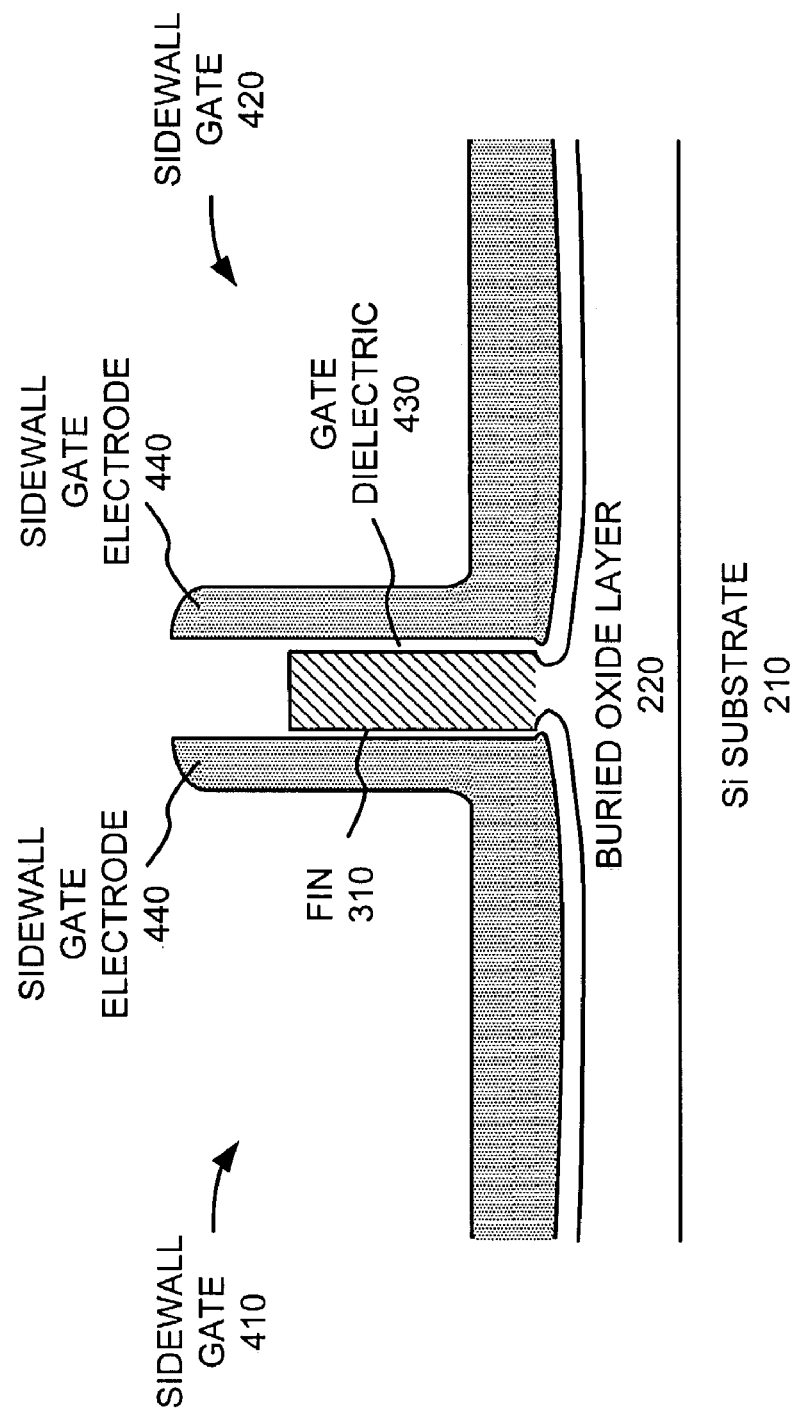

Cover 260, top gate electrode 250, and gate dielectric 240 may then optionally be removed, as illustrated in FIG. 5 (act 170). For example, a mask, or a similar mechanism, may be used in a conventional manner to permit cover 260, top gate electrode 250, and gate dielectric 240 to be etched, while minimizing effects to sidewall gates 410 and 420. In another implementation, gate dielectric 240 may optionally be left intact (i.e., not removed with cover 260 and top gate electrode 250).

Figure 6:
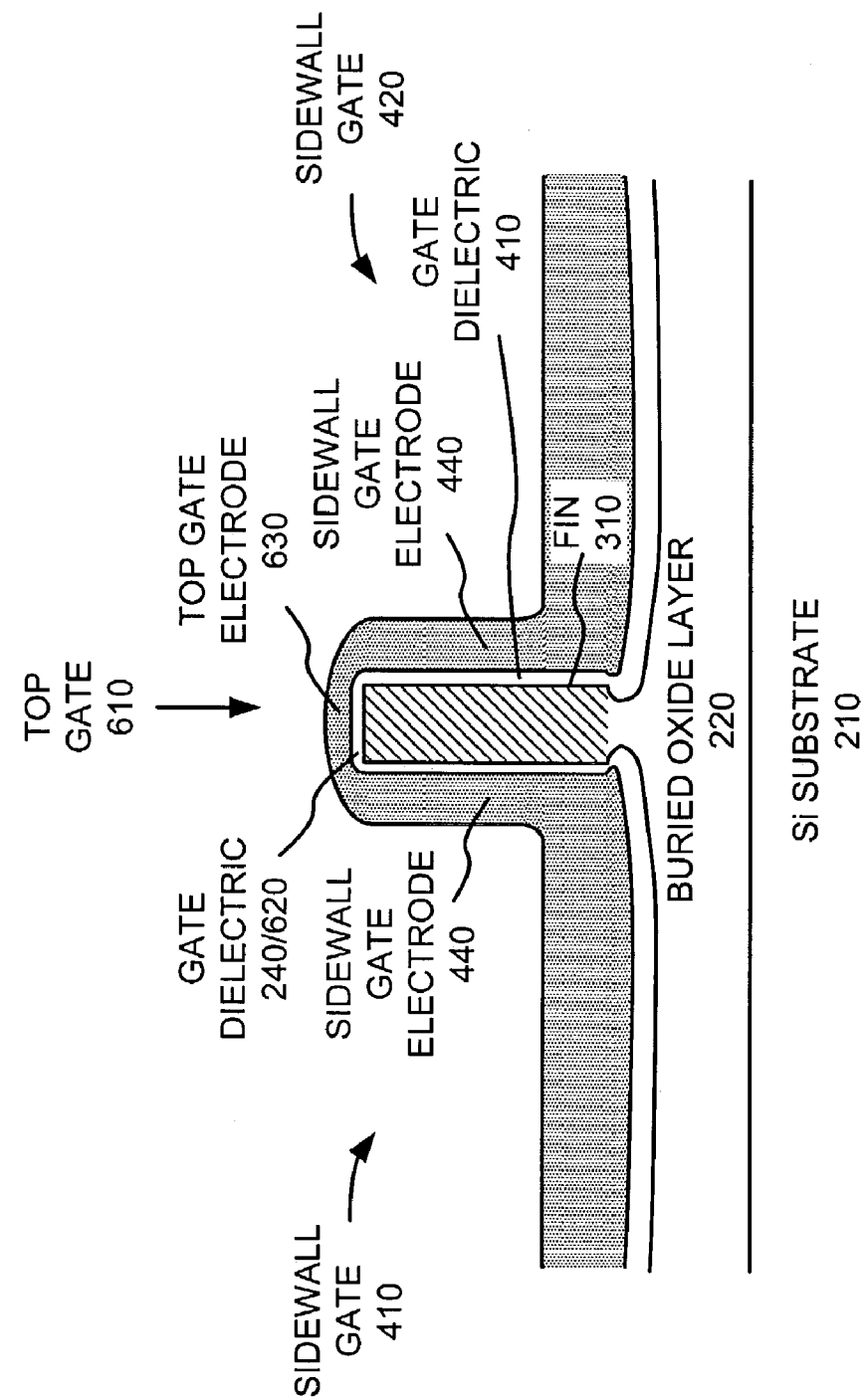

Top gate 610 may then optionally be formed (act 180), as illustrated in FIG. 6. For example, a gate dielectric material 620 may optionally be regrown or formed on fin 310. In this case, gate dielectric material 620 may include a material similar to the material used for gate dielectric 240 and may be formed at a thickness ranging from approximately 5 Å to 30 Å. Alternatively, gate dielectric material 240 may remain. Top gate electrode material 630 may then optionally be deposited over gate dielectric material 240/620 to form top gate 610. Gate electrode material 630 may include a material similar to the material used for top gate electrode 250 and may be deposited to a thickness ranging from approximately 100 Å to 1000 Å.

The resulting semiconductor device 200 illustrated in FIG. 6 may include three gates (i.e., sidewall gate 410, sidewall gate 420, and top gate 610). Conventional MOSFET fabrication processing can be used to complete the transistor (e.g., forming the source and drain regions), contacts, interconnects and inter-level dielectrics for the triple gate MOSFET.

Gate Around MOSFET

Figure 7:
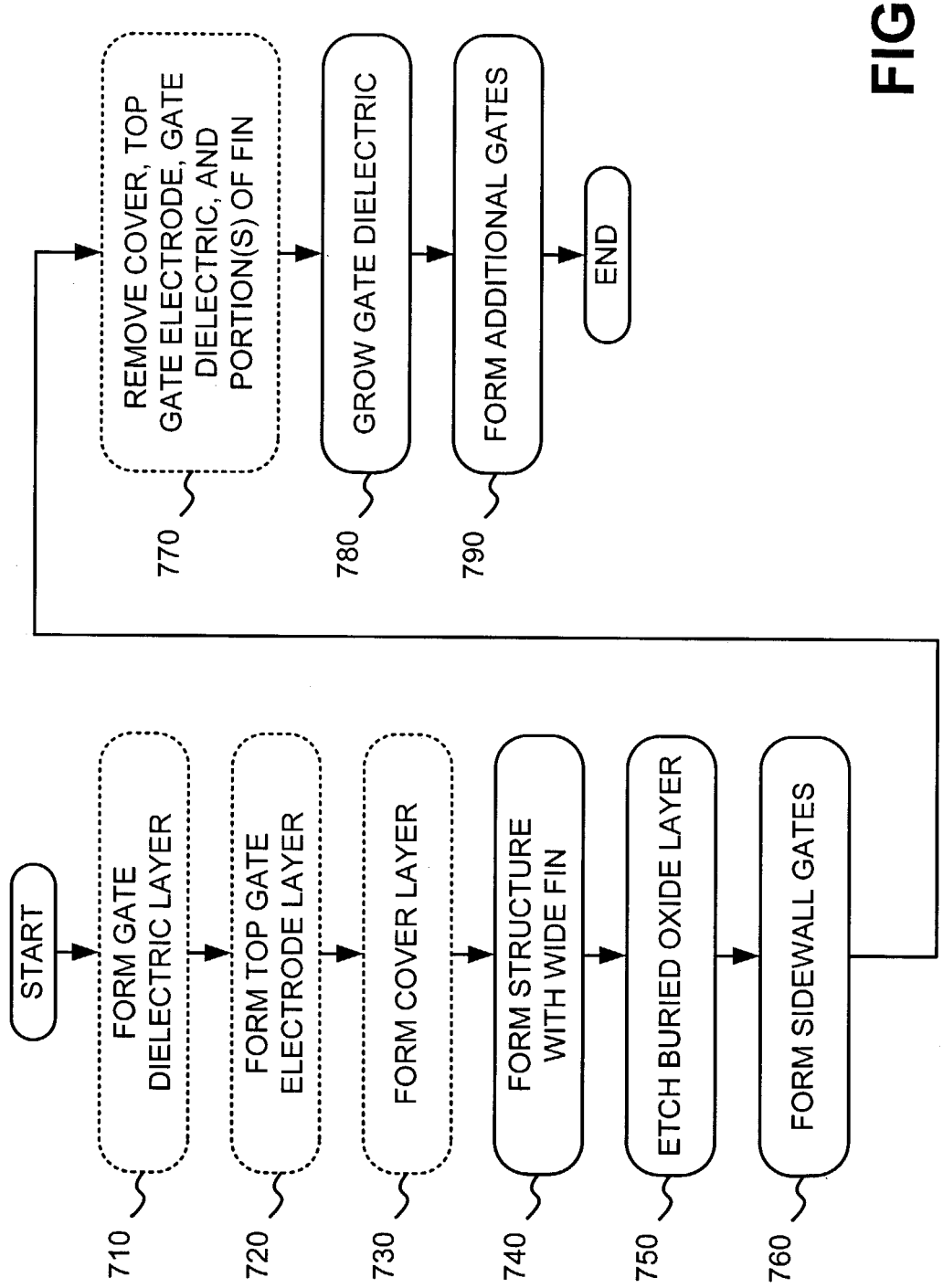
FIG. 7 illustrates an exemplary process for fabricating a gate around MOSFET in an implementation consistent with the principles of the invention.
Figure 8:
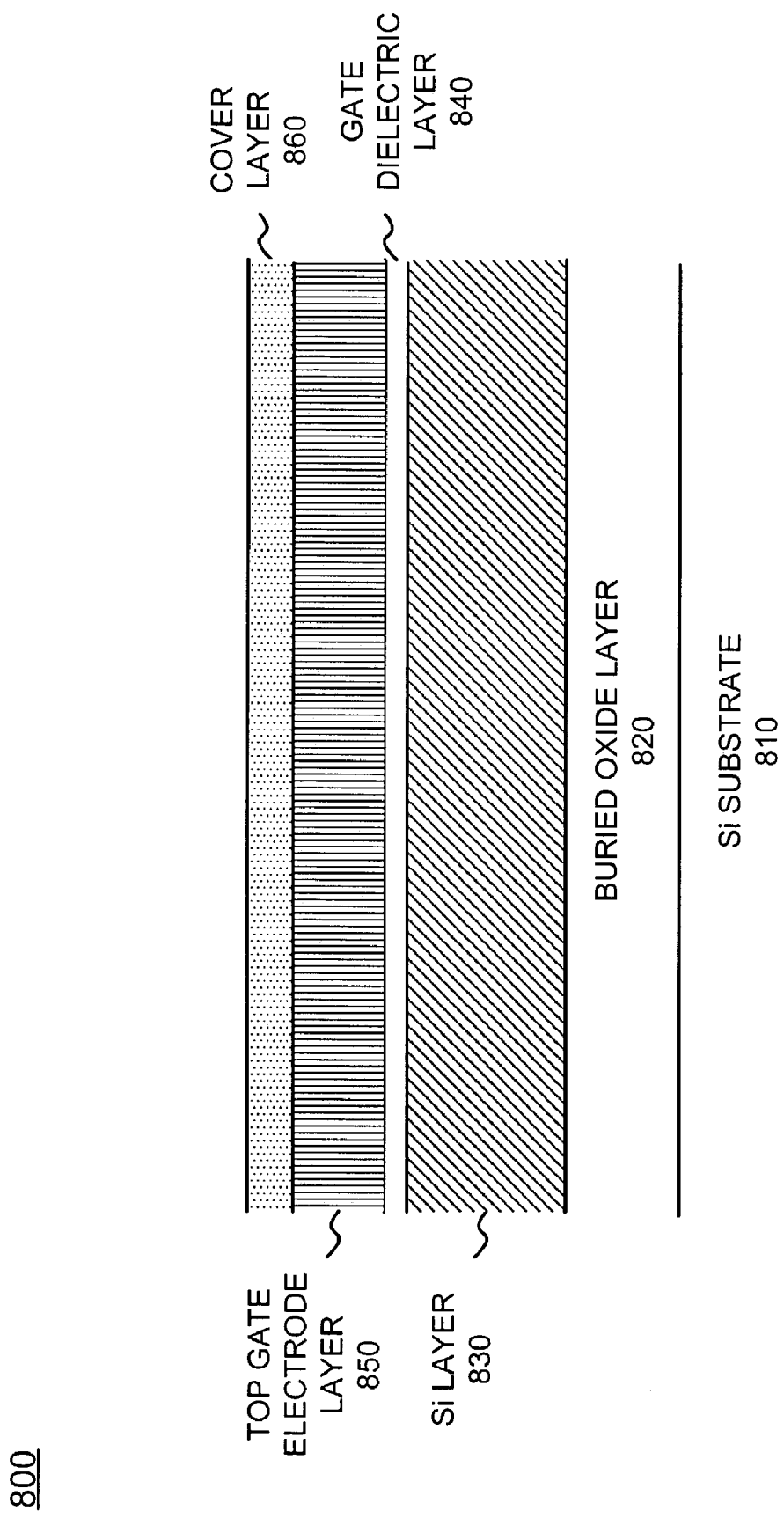
FIGS. 8-12 illustrate exemplary cross-sectional views of a gate around MOSFET fabricated according to the processing described in FIG. 7.

FIG. 7 illustrates an exemplary process for fabricating a gate around MOSFET in an implementation consistent with the principles of the invention. FIGS. 8-12 illustrate exemplary cross-sectional views of a gate around MOSFET fabricated according to the processing described with respect to FIG. 7. Processing may begin with semiconductor device 800. Semiconductor device 800 may include a SOI structure that includes silicon substrate 810, buried oxide layer 820, and silicon layer 830. The SOI structure may be similar to the one described with respect to FIG. 2. Optionally, a gate dielectric layer 840 (act 710), a top gate electrode layer 850 (act 720), and a cover layer 860 (act 730) may be formed on the SOI structure in a manner similar to that described above with respect to acts 110-130 of FIG. 1.

Figure 9:
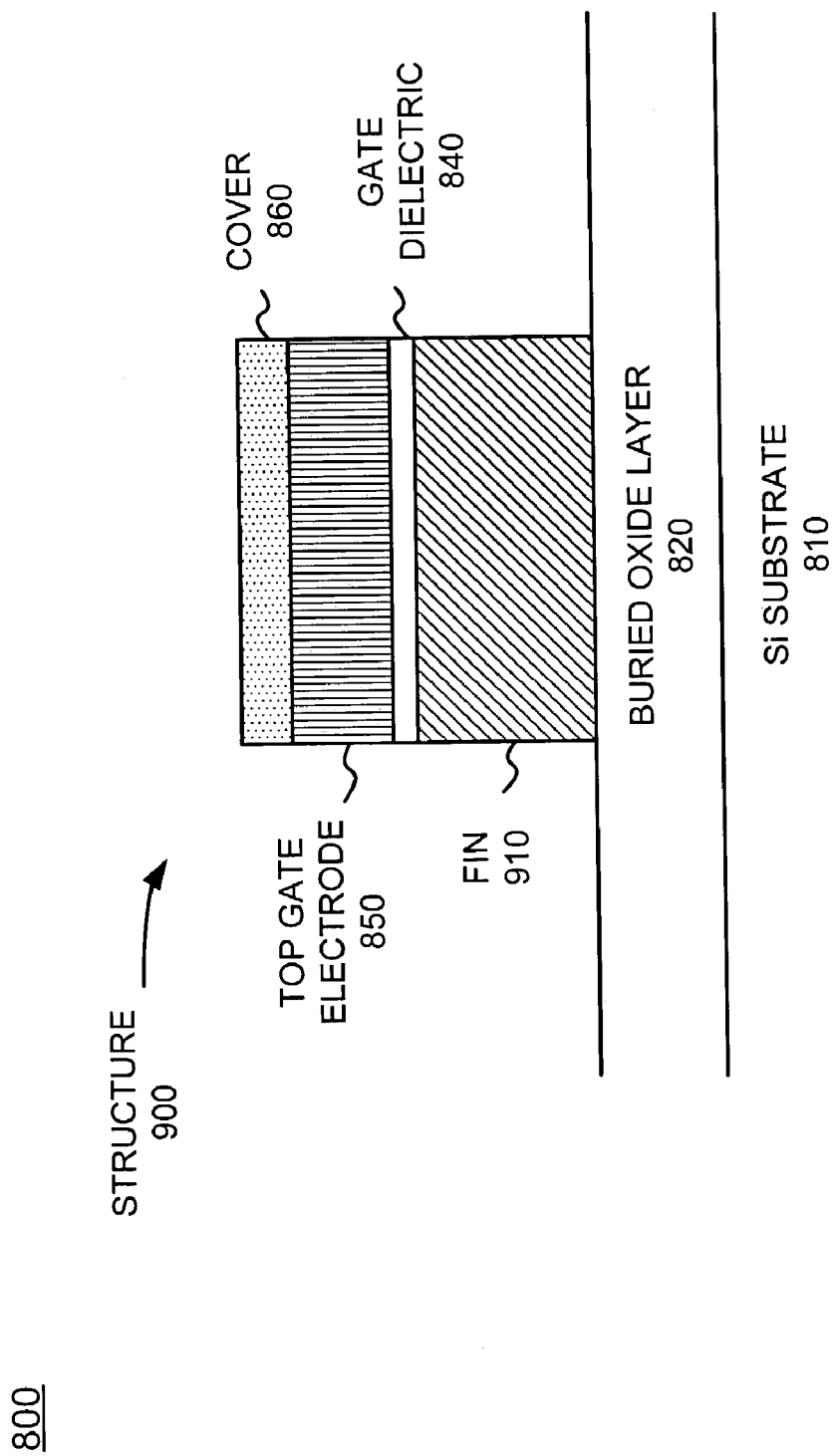

Silicon layer 830, gate dielectric layer 840, and top gate electrode layer 850 may be patterned by conventional lithographic techniques (e.g., electron beam (EB) lithography). Silicon layer 830 and layers 840/850 may then be etched using well-known etching techniques to form a structure 900, as illustrated in FIG. 9 (act 740). Structure 900 includes a fin 910, gate dielectric 840, top gate electrode 850, and cover 860. Fin 910, consistent with the present invention, may be relatively wide. For example, the width of fin 910 may range from approximately 50 Å to 1000 Å.

Following the formation of structure 900, a portion of buried oxide layer 820 may be removed using, for example, one or more conventional etching techniques (act 750). In one implementation, buried oxide layer 820 may be etched to a depth ranging from about 200 Å to about 500 Å. During the etching, a portion of buried oxide layer 820 below fin 910 may be removed, as illustrated in FIG. 10.

Figure 10:
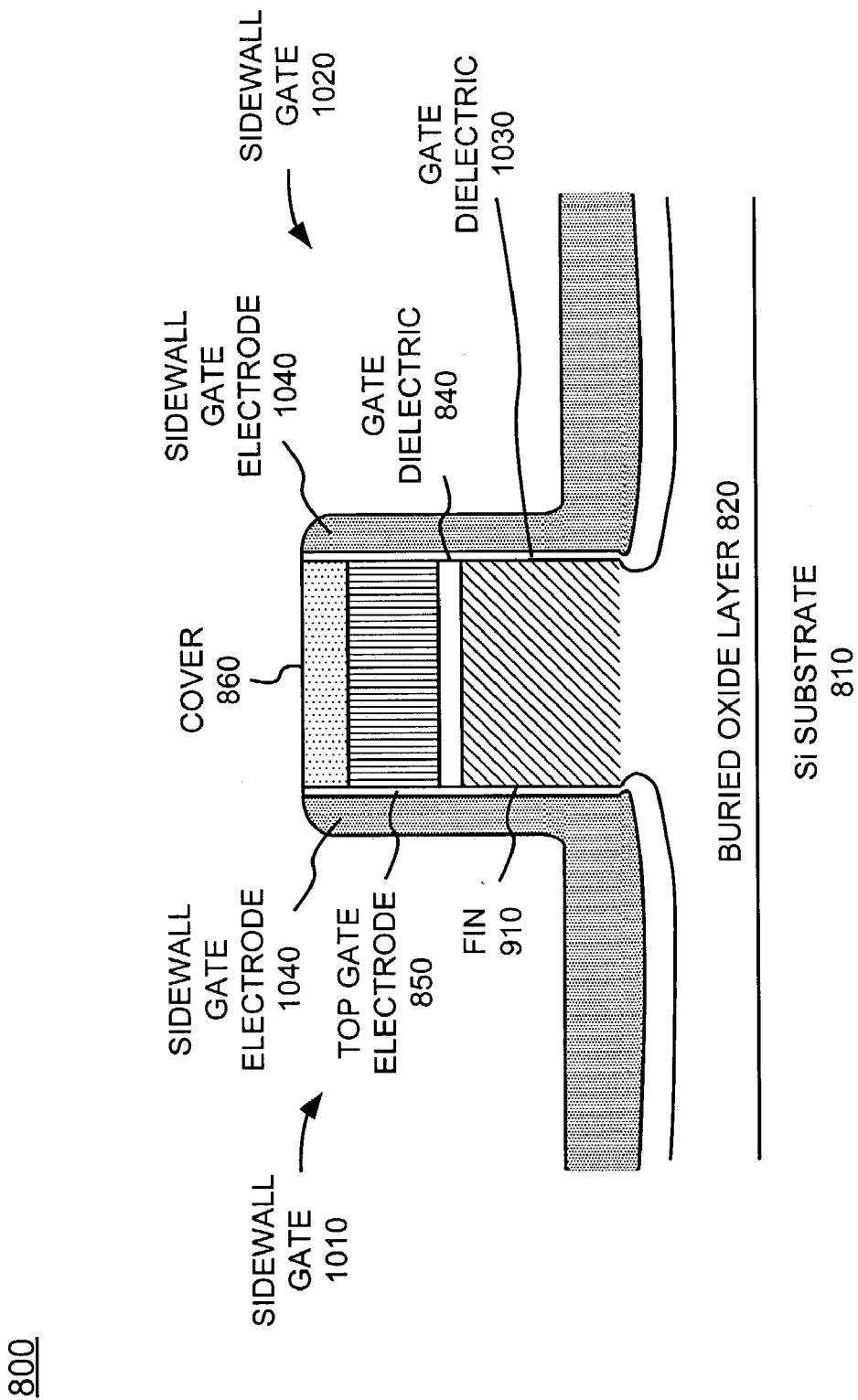

Sidewall gates 1010 and 1020 may then be formed, as illustrated in FIG. 10 (act 760). For example, a gate dielectric layer 1030 may be deposited or thermally grown using known techniques. Gate dielectric layer 1030 may be formed at a thickness ranging from approximately 5 Å to 30 Å. Gate dielectric layer 1030 may include conventional dielectric materials, such as an oxide (e.g., silicon dioxide). In other implementations, a silicon nitride or another material may be used as the gate dielectric material.

A sidewall gate electrode layer 1040 may be deposited over semiconductor device 800. Gate electrode layer 1040 may be formed at a thickness ranging from approximately 100 Å to 1000 Å. Similar to top gate electrode layer 850, a number of materials may be used for sidewall gate electrode layer 1040. Gate electrode layer 1040 may be planarized, using, for example, a CMP to expose the top surface of cover 860 and form two separate sidewall gates 1010 and 1020, as illustrated in FIG. 10.

Figure 11:
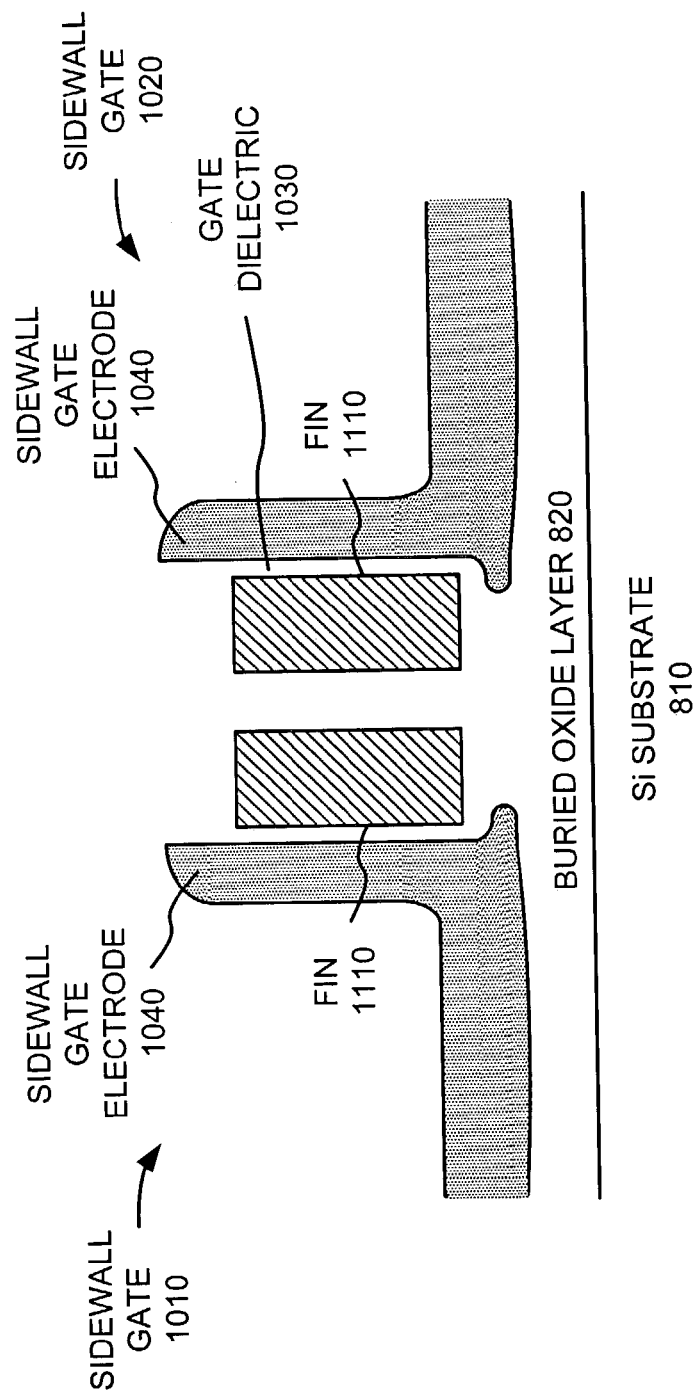

Cover 860, top gate electrode 850, gate dielectric 840, and one or more portions of fin 910 may then optionally be removed, as illustrated in FIG. 11 (act 770). For example, a conventional patterning technique and etching technique may be used to remove cover 860, top gate electrode 850, gate dielectric 840, and one or more portions of fin 910, while minimizing effects to sidewall gates 1010 and 1020. In another implementation, gate dielectric 840 may optionally be left intact over those portions of fin 910 that are not removed. The etching of fin 910 may terminate on buried oxide layer 820, as illustrated in FIG. 11, to form two separate fins 1110. Each of fins 1110 has a width ranging from approximately 50 Å to 1000 Å. As shown in FIG. 11, two fins 1110 are formed. In other implementations, more than two fins 1110 may be formed.

Figure 12:
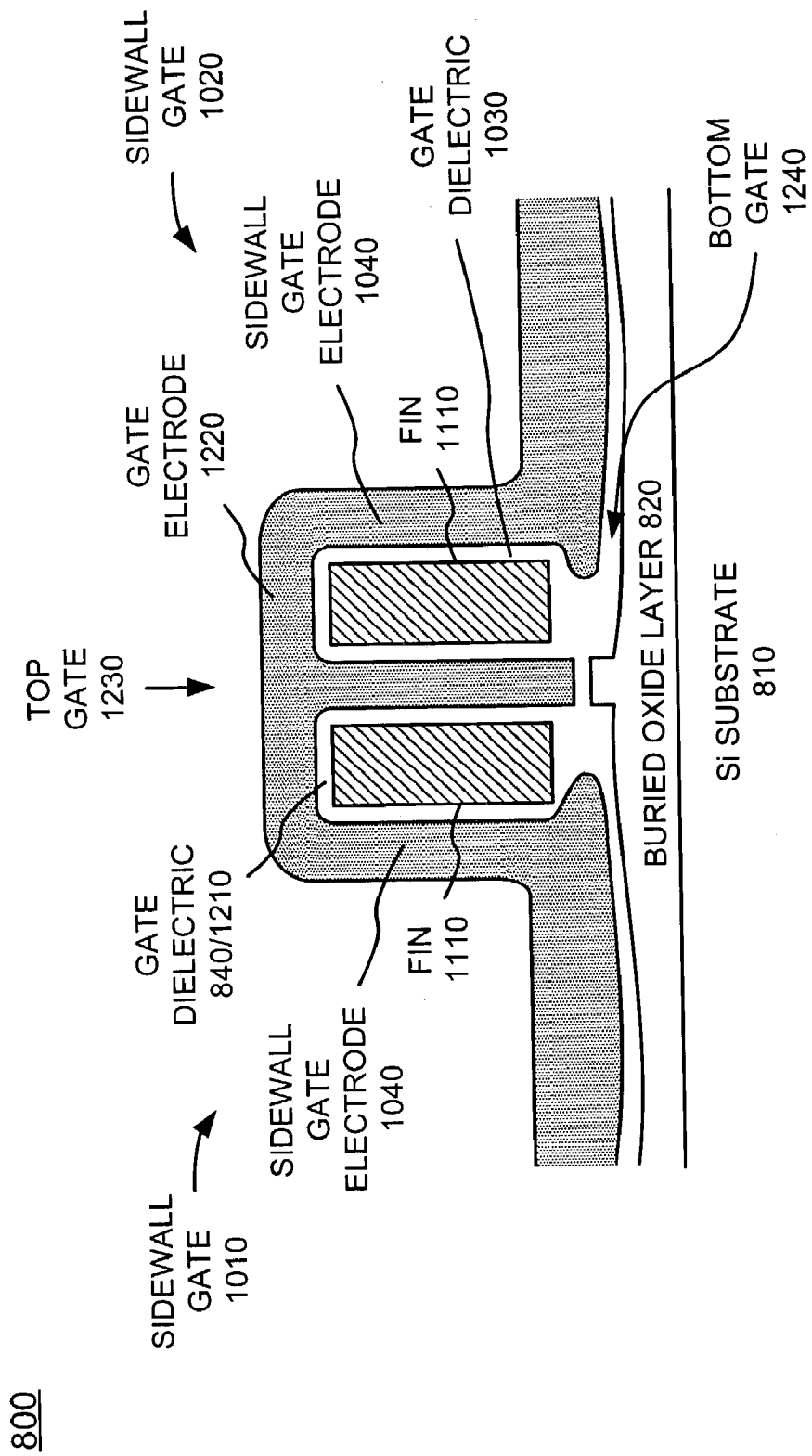

Gate dielectric 1210 may then be thermally grown on the exposed surfaces of fins 1110 (act 780), as illustrated in FIG. 12. For example, gate dielectric 1210 may be grown to a thickness of about 5 Å to about 30 Å. Gate dielectric 1210 may include a material similar to that used for gate dielectric 840. Alternatively, gate dielectric 840 may remain over the top surfaces of fins 1110 and gate dielectric 1210 may be grown on the exposed side surfaces of fins 1110.

Additional gates may then be formed (act 790), as illustrated in FIG. 12. For example, gate electrode material 1220 may optionally be deposited over gate dielectric material 840/1210 to form additional gates. Gate electrode material 1220 may then be patterned and etched to form the additional gates. Gate electrode material 1220 may include a material similar to the material used for top gate electrode layer 850 and/or sidewall gate electrode layer 1040 and may be deposited to a thickness ranging from approximately 100 Å to 1000 Å.

The resulting semiconductor device 800 may include four (or more) gates (i.e., sidewall gate 1010, sidewall gate 1020, top gate 1230, and bottom gate 1240), as illustrated in FIG. 12. Top gate 1230 may be formed over fins 1110 and bottom gate 1240 may be formed under fins 1110. Conventional MOSFET fabrication processing can be used to complete the transistor (e.g., forming the source and drain regions), contacts, interconnects and inter-level dielectrics for the gate around MOSFET.

OTHER IMPLEMENTATIONS

Figure 13:
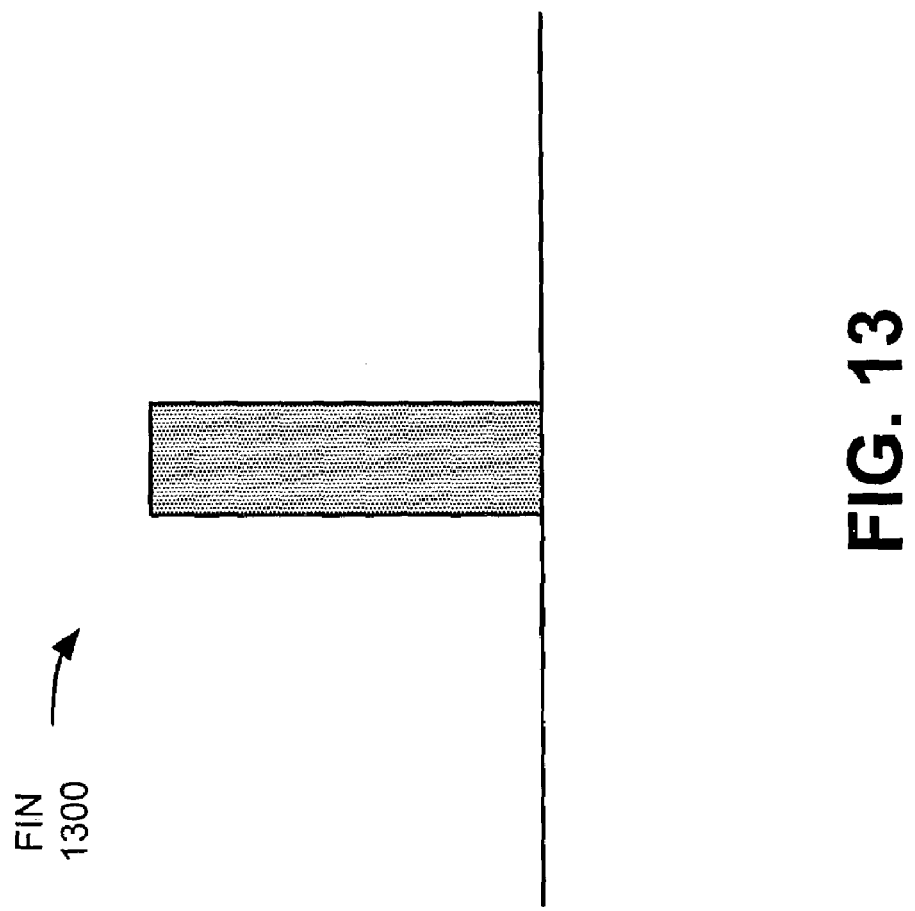
FIGS. 13-15 illustrate an exemplary process for minimizing the thermal budget required to diffuse active dopants in a polysilicon gate.
Figure 14:
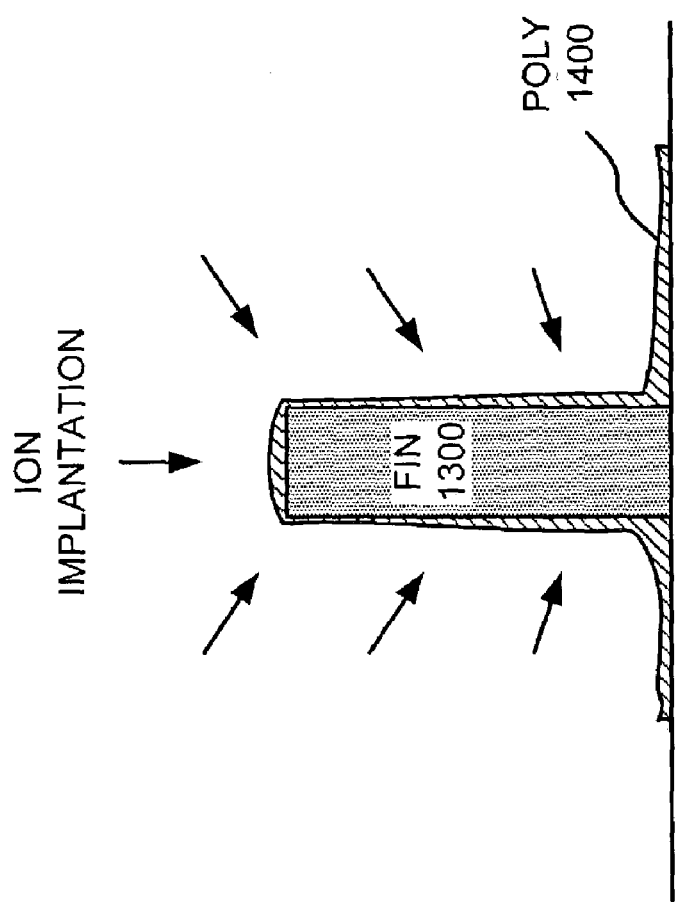
Figure 15:
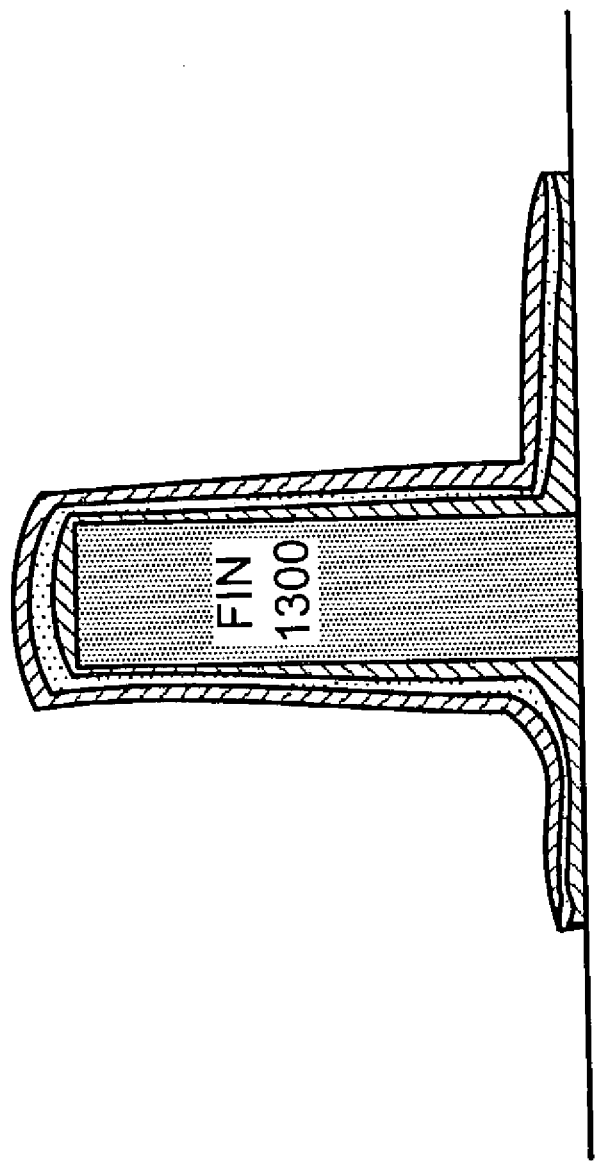

There is a need in the art to minimize the thermal budget required to diffuse and activate dopants in a polysilicon gate. FIGS. 13-15 illustrate an exemplary process for minimizing the thermal budget required to diffuse active dopants in a polysilicon gate. As shown in FIG. 13, a fin 1300 may be formed on a substrate, such as a SOI substrate. Fin 1300 may be formed using, for example, processes similar to those described above with regard to earlier implementations.

A thin polysilicon material 1400 may be deposited on fin 1300, as shown in FIG. 14. An ion implantation process may be performed to dope polysilicon material 1400 with dopants. A conventional annealing process may then be performed. These acts may be repeated one or more additional times, as shown in FIG. 15. In other words, fin 1300 may be subjected to multiple polysilicon deposits, implants, and anneals to minimize the thermal budget required to dope the polysilicon.

Figure 16:
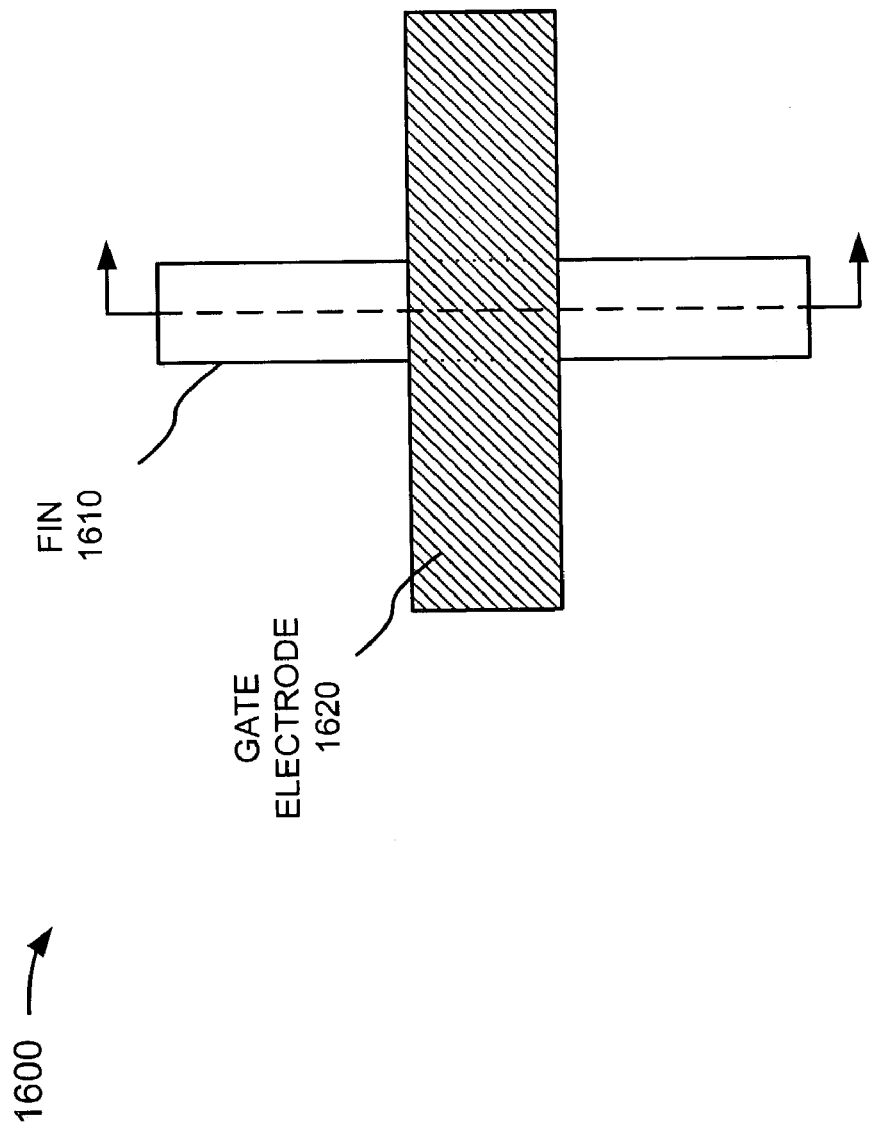
FIGS. 16-18 illustrate an exemplary process for forming highly doped abrupt junctions.
Figure 17:
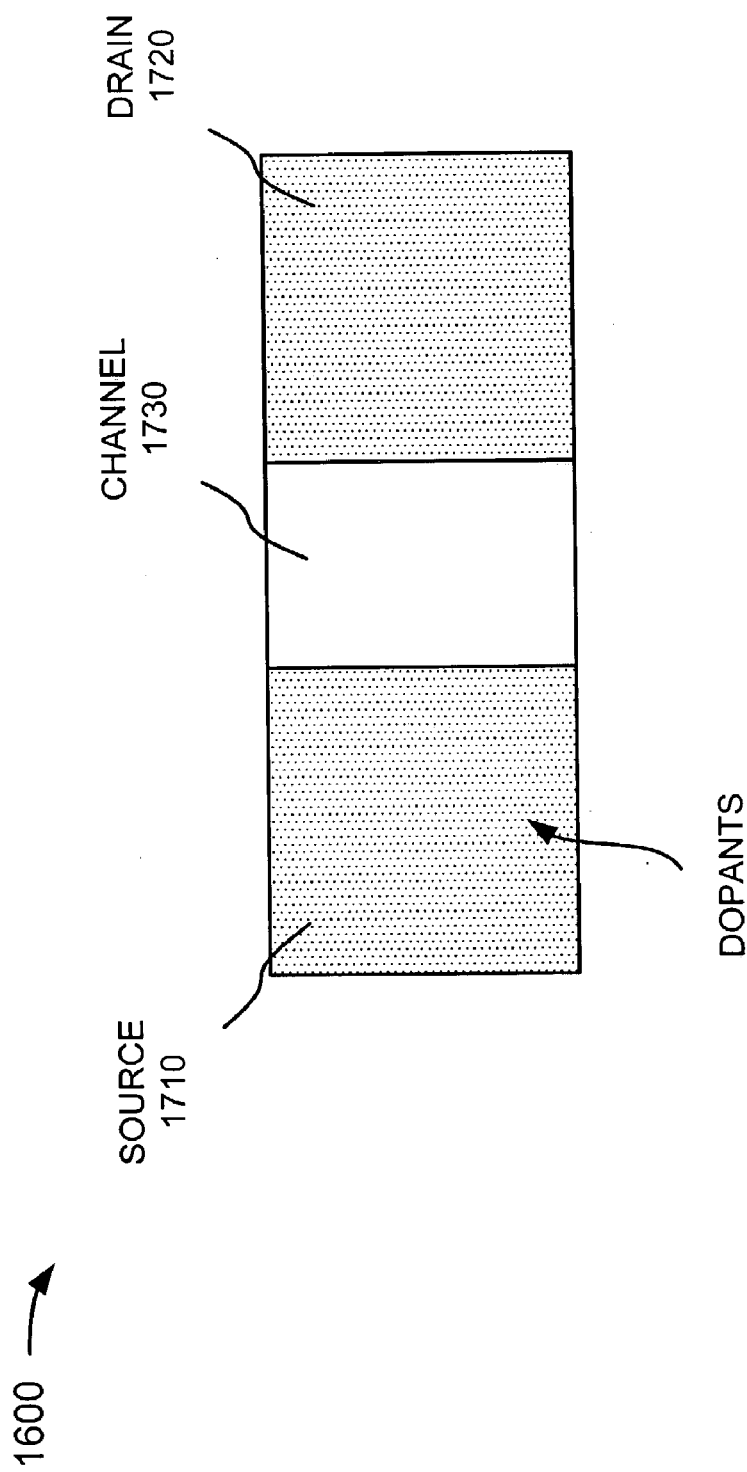
Figure 18:
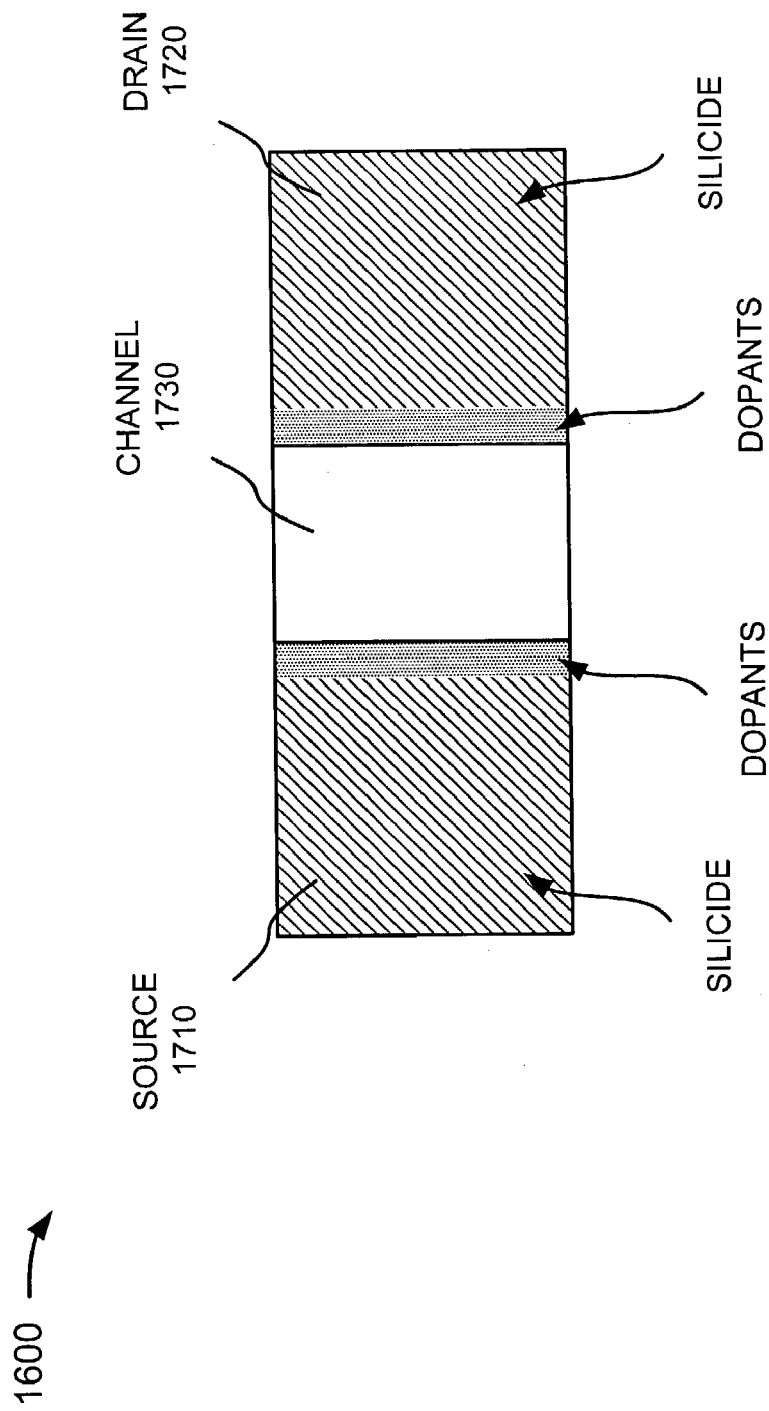

There is also a need in the art to form highly doped abrupt junctions. FIGS. 16-18 illustrate an exemplary process for forming highly doped abrupt junctions. A top view of an exemplary FinFET 1600 is illustrated in FIG. 16. FinFET 1600 includes a fin 1610 and a gate electrode 1620. A side view of FinFET 1600 is illustrated in FIG. 17. FinFET 1600 includes source region 1710, drain region 1720, and channel 1730. Source region 1710 and drain region 1720 may be implanted with dopants.

After the doping process, source region 1710 and drain region 1720 may be silicided by depositing a metal over the source/drain regions, followed by an annealing to form a metal-silicide material, as illustrated in FIG. 18. Dopants may pile-up at the channel interface to form high concentrated abrupted junctions.

CONCLUSION

Implementations consistent with the principles of the invention provide triple gate and gate around FinFET devices and methods of manufacturing these devices.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 1 and 7, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A gate around metal-oxide semiconductor field-effect transistor (MOSFET), comprising:
   at least two fins formed on an oxide layer, each of the at least two fins having first and second sidewalls;
   a first sidewall gate structure formed adjacent the first sidewall of a first one of the fins;
   a second sidewall gate structure formed adjacent the second sidewall of a second one of the fins;
   a top gate structure formed on an upper surface of the first and second fins; and
   a bottom gate structure formed to extend under a portion of the of each of the first and second fins, the bottom gate structure extending beneath the first sidewall of the first fin and beneath the second sidewall of the second fin and not extending beneath the second sidewall of the first fin or beneath the first sidewall of the second fin.

2. The gate around MOSFET of claim 1, wherein each of the fins has a width ranging from approximately 50 Å to 500 Å.

3. The gate around MOSFET of claim 1, wherein the first sidewall gate structure, the second sidewall gate structure, the top gate structure, and the bottom gate structure include a same gate material.

4. A fin field effect transistor (FinFET), comprising:
   a first fin formed on an oxide layer, the first fin having first and second sidewalls;
   a second fin formed on the oxide layer, the second fin having first and second sidewalls;
   a third fin formed on the oxide layer, the third fin having first and second sidewalls;
   a dielectric layer formed over the first, second and third fins;
   a first gate formed adjacent the dielectric layer and the first fin;
   a second gate formed adjacent the dielectric layer and the second fin;
   a top gate formed adjacent an upper surface of the first, second and third fins; and
   a bottom gate extending under a portion less than an entire width of at least two of the first, second or third fins, wherein the bottom gate extends beneath the first sidewall of the first fin and beneath the second sidewall of the third fin and does not extend beneath the second sidewall of the first fin or beneath the first sidewall of the third fin.

5. A gate around metal-oxide semiconductor field-effect transistor (MOSFET), comprising:
   first and second fins formed on an oxide layer substantially parallel to one another and spaced a distance apart to form a cavity between the first and second fins; and
   a gate material formed adjacent side surfaces of the first and second fins and formed over upper surfaces of the first and second fins, and formed to substantially fill an entirety of the cavity between the first and second fins, wherein the gate material comprises:
   a first sidewall gate structure formed adjacent the first fin,
   a second sidewall gate structure formed adjacent the second fin,
   a top gate structure formed on an upper surface of the first and second fins, and
   a bottom gate structure extending under a portion of each of the first and second fins, the portion being less than an entire width of each of the first and second fins.

6. The gate around MOSFET of claim 5, wherein the bottom gate structure extends beneath an outer sidewall of the first fin and beneath an outer sidewall of the second fin, does not extend beneath an inner sidewall of the first fin and does not extend beneath an inner sidewall of the second fin.

7. The gate around MOSFET of claim 5, wherein the gate material has a thickness ranging from approximately 100 Å to 1,000 Å.

8. The gate around MOSFET of claim 5, wherein each of the first and second fins has a width ranging from approximately 50 Å to 500 Å.

9. The gate around MOSFET of claim 5, wherein the first and second fins comprise silicon.

10. The gate around MOSFET of claim 5, further composing:
    a dielectric layer formed adjacent surfaces of the first and second fins, wherein the dielectric layer is formed between the gate material and the surfaces of the first and second fins.

11. The gate around MOSFET of claim 10, wherein the dielectric layer comprises an oxide or a nitride.

12. The gate around MOSFET of claim 10, wherein the dielectric layer comprises silicon dioxide.

13. The gate around MOSFET of claim 10, wherein the dielectric layer comprises silicon nitride.

14. The gate around MOSFET of claim 10, wherein the dielectric layer comprises a thickness ranging from about 5 Å to about 30 Å.

15. The gate around MOSFET of claim 1, wherein the portion is less than an entire width of each of the first and second fins.

16. The FinFET of claim 4, wherein the portion is less than an entire width of each of the at least two fins.

17. The FinFET of claim 4, wherein the bottom gate extends under a portion of the first and third fins and not under the second fin, the second fin being located between the first and third fins.

18. The gate around MOSFET device of claim 6, wherein the inner sidewall of the first fin and the inner sidewall of the second fin are located adjacent the gate material filling the cavity between the first and second fins.

* * * * *